United States Patent [19]

Blaum et al.

[11] Patent Number: 5,285,454
[45] Date of Patent: Feb. 8, 1994

[54] METHOD AND APPARATUS FOR ENCODING AND DECODING UNORDERED ERROR CORRECTING CODES

[75] Inventors: Miguel M. Blaum, San Jose; Jehoshua Bruck, Palo Alto, both of Calif.

[73] Assignee: International Business Machines Corporation, Armonk, N.Y.

[21] Appl. No.: 715,524

[22] Filed: Jun. 14, 1991

[51] Int. Cl.⁵ .............................. G06F 11/10
[52] U.S. Cl. ................................ 371/37.1
[58] Field of Search ...................... 371/1, 37.1

[56] References Cited

U.S. PATENT DOCUMENTS

| | | | |
|---|---|---|---|
| 4,656,634 | 4/1987 | Lombardi et al. | 371/1 |
| 4,691,319 | 9/1987 | Bose et al. | 371/54 |
| 4,908,827 | 3/1990 | Gates | 371/43 |
| 4,980,897 | 12/1990 | Decker et al. | 371/43 |
| 5,208,816 | 5/1993 | Seshardi et al. | 371/43 |

OTHER PUBLICATIONS

Berger, A Note On Error Detection Codes For Asymmetric Channels, Info. and Control, vol. 4, pp. 68–73, 1961.

Verhoeff, An Updated Table of Minimum Distance Bounds For Binary Linear Codes, IEEE Transactions on Info. Theory, Vo. IT-33, pp. 665–680, Sep. 1987.

*Primary Examiner*—Charles E. Atkinson
*Attorney, Agent, or Firm*—Henry E. Otto, Jr.

[57] ABSTRACT

An unordered error correcting code is constructed by an encoding method and apparatus that accepts k bits of information and is capable of providing unordered ECC codewords. All pairs of these codewords are at least a distance d apart, where $d \geq (2t+1)$ and t is the maximum number of errors correctable by the code. The k bits of information are encoded with an ECC encoding algorithm to produce ECC codewords that are at least distance d apart. The least number of tail bits required to produce the unordered ECC codewords is appended to each of the ECC codewords. The tail bits for each codeword are constructed by dividing its weight by d for determining the integer part of the resulting quotient, generating a binary representation of the value of its integer part, and complementing said binary representation. A noisy received version of the ECC codeword with tail bits truncated is decoded and a preselected error correcting algorithm is applied to correct $t_1$ actual errors and produce a decoded ECC codeword. Tail bits corresponding to the decoded ECC codeword are generated and compared with segregated tail bits for the noisy received ECC codeword for determining the number $t_2$ of errors actually detected. The k information bits derived from the decoded ECC codeword are outputted when $(t_1+t_2) \leq t$.

8 Claims, 3 Drawing Sheets

METHOD AND APPARATUS FOR ENCODING AND DECODING UNORDERED ERROR CORRECTING CODES

CROSS REFERENCE TO RELATED APPLICATIONS

[A] U.S. Ser. No. 07/715,279, filed concurrently herewith by Blaum and Bruck, entitled "Coding Method for Skewed Transition Detection in Parallel Asynchronous Communication Systems"; and

[B] U.S. Ser. No. 07/715,522, filed concurrently herewith by Blaum and Bruck, entitled "Coding Method for Skewed Transition Correction in Parallel Asynchronous Communication Systems".

FIELD OF THE INVENTION

This invention relates to improved unordered error correcting codes and to a method and apparatus for encoding and decoding said codes, and more particularly relates to a method and apparatus which can satisfy distance properties between codewords of unordered codes, and thus correct a preselected number of errors.

BACKGROUND OF THE INVENTION

To fully understand unordered codes it is best to consider an example. For a binary vector u of length n, $u = u_1, u_2, \ldots, u_n$. The set of non-zero bits of vector u are hereafter referred to as the "support" of u. For instance, for n=6, if u=100101, the support of u is the set $\{1,4,6\}$. Two vectors u and v of length n are considered unordered when their supports are unordered as sets; i.e., neither of them contains the other. Thus, u=100101 and v=010101 are unordered because their corresponding supports are $\{1,4,6\}$ and $\{2,4,6\}$. By contrast, the vector w=000101 which has a support of $\{4,6\}$ would not be unordered relative to either u or v because its support $\{4,6\}$ is a subset of the support of both u and v.

One of the early descriptions of unordered codes is by J. M. Berger, "A Note on Error Detection Codes for Asymmetric Channels", Information and Control, Vol. 4, pp. 68-73, 1961. He used the term "sum code" in which the sum of the number of 1's appearing as information (e.g., data) bits was converted to a binary representation and the complement taken for each of the resulting binary digits. Unordered codes were stated to be especially useful in error detection for asymmetric channels; i.e., those in which only one type of error occurs in which either only 1's are converted to 0's or only 0's are converted to 1's. However, Berger's code did not have error correcting capability.

More recently, unordered codes have attracted wide attention in coding theory. Among their applications are protecting write-only memories (WOM) against hostile overwrites, use in parallel asynchronous communications, and detection of asymmetric and unidirectional errors in computer memories.

Examples of optimal unordered codes from the point of view of the number of codewords they contain are the so-called "balanced" codes; i.e., the number of 1 bits (called the "weight" of a vector) is half the length of the vector. Thus, in the above example, both u and v are balanced because the number of 1 bits in each is 3 and the length is 6 bits.

Balanced codes and also balanced codes that incorporate error correction are known in the prior art. However, despite the fact that balanced codes are optimal as unordered codes, they are not easy to encode and decode except when the length n of the code is a relatively small number. Also, balanced codes are not "systematic", a term which connotes codes in which the information part of the codeword and the redundancy part of the codeword are separated. Systematic codes are convenient in most applications. Some systematic unordered codes are presented by Berger. However, the Berger codes cannot correct errors.

There is a need (1) for unordered codes which have error correcting capability and are easy to encode and decode, and (2) for a method and apparatus for encoding and decoding unordered systematic codes that provide error correction capability.

SUMMARY OF THE INVENTION

An unordered error correcting code is constructed by an encoding method and apparatus that accepts k bits of information and is capable of providing unordered ECC codewords. Each arbitrary pair of these codewords is at least a distance d apart, where $d \geq (2t+1)$ and t is the maximum number of errors correctable by the code.

The k bits of information are encoded with an ECC encoding algorithm to produce ECC codewords that are at least distance d apart. The least number of tail (i.e., redundancy) bits required to produce the unordered ECC codewords is appended to each of the ECC codewords. The "weight" of a codeword (like Berger's "sum code") is equal to the number of 1's it contains. The tail bits for each codeword are constructed by dividing its weight by d for determining the integer part of the resulting quotient, generating a binary representation of the value of its integer part, and complementing said binary representation.

A noisy received version of the ECC codeword with tail bits truncated is decoded and a preselected error correcting algorithm is applied to correct $t_1$ actual errors and produce a decoded ECC codeword. Tail bits corresponding to the decoded ECC codeword are generated and compared with segregated tail bits for the noisy received ECC codeword for determining the number $t_2$ of errors actually detected. The k information bits derived from the decoded ECC codeword are outputted when $(t_1 + t_2) \leq t$.

An error detection-responsive protocol is initiated when $(t_1 + t_2) > t$.

PRELIMINARY DESCRIPTION

As known in the art, (Hamming) distance between two vectors is the number of coordinates (i.e., locations, such as bit positions) in which they differ. The term "distance" as hereinafter used refers to (Hamming) distance. The minimum (Hamming) distance of a code is the minimum distance between each arbitrary pair of vectors in the code. The error correcting capability of a code is given by the number $(d-1)/2$, where d denotes the minimum distance of the code and x the integer part of a variable x. The (Hamming) "weight" of a vector v, denoted w(v), is the number of 1's in v. The notation [n,k,d] for an error correcting code (ECC) means the following: the code has length n (i.e., all the codewords have n bits); k, called the "dimension" of the code, is the number of information (e.g., data) bits with the result that (n-k) bits are redundant; and d is the minimum distance of the code.

DESCRIPTION OF THE PREFERRED EMBODIMENT

Overview

In accordance with this invention, unordered error correcting codes and a method and apparatus for encoding and decoding these codes are disclosed. These unordered codes have error correcting capability, giving them a resilience against a preselectable number of errors. There are many applications for such error correcting unordered codes, such as in the detection of a preselected number of symmetric errors and the detection of all unidirectional (or asymmetric) errors. The codes presented herein can be made systematic, as hereafter defined, and encodable and decodable by efficient encoding and decoding algorithms, respectively.

The improved code herein described is ideally suitable for use in parallel asynchronous communication systems of the type disclosed in the above-cited related applications [A] and [B].

ENCODING

To correct t errors, the k information bits are encoded into a t error correcting code (ECC). (For tables with the best ECCs, reference should be made to T. Verhoeff, "An Updated Table of Minimum Distance Bounds for Binary Linear Codes", IEEE Transactions on Information Theory, Vol. IT-33, pp. 665-680, September 1987.) Then, according to the invention, sufficient redundant bits are added to each ECC codeword to ensure that all codewords are rendered unordered. (For simplicity, these added redundant bits are termed the "tail".) This addition can be created by using Berger's construction; i.e., take the weight of the codeword and write the complement thereof in binary. However, because applicants' code is already an error correcting code, savings of one or more bits can be achieved in accordance with the invention in the following manner: Assume that each arbitrary pair of the ECC codewords is at least a preselected minimum distance d apart, divide the weight of the codeword by d, take the integer part of the resulting number (quotient) and represent it in binary form, and then write its complement.

Figure 1:
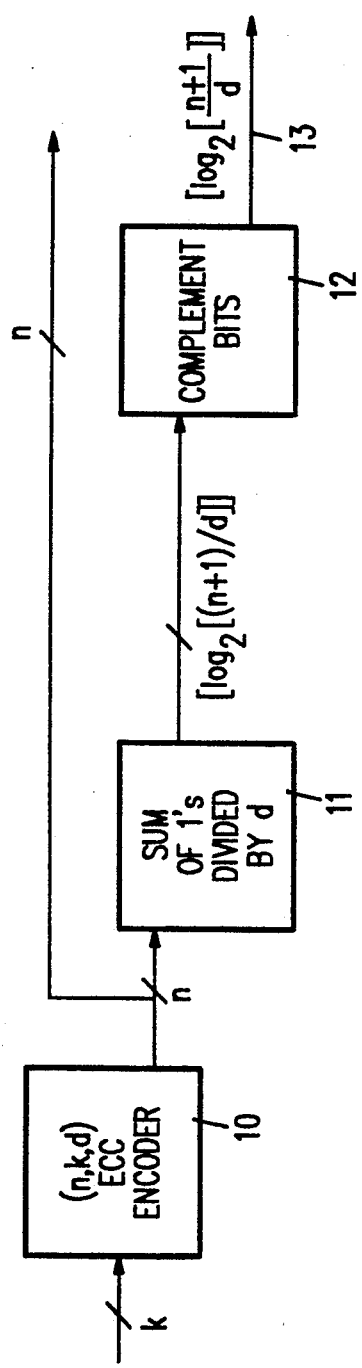
FIG. 1 is a block diagram of an apparatus for encoding an unordered error correcting code in accordance with the present invention.

As illustrated in FIG. 1, an apparatus for encoding an unordered ECC comprises an ECC encoder 10 that receives k information bits and converts them into n ECC bits, each pair of which is at least a preselected minimum distance d apart. The relationship between the maximum number of errors the code can correct and the minimum distance d is given by $d \geq 2t+1$. A tail generating circuit 11 divides the weight of the codeword by d, takes the integer part thereof, and writes this number in binary form, producing an output of length $\lceil \log_2 \lfloor (n+1)/d \rfloor \rceil$. This integer part is fed to a circuit 12 that complements it to provide, as an output in line 13, a tail of length $$\lceil \log_2 \lfloor \frac{n+1}{d} \rfloor \rceil$$

that is appended to each ECC codeword. The symbol $\lceil x \rceil$ designates the next larger integer; i.e., $\lceil x \rceil + 1$, if $x \neq$ integer.

Encoding Example A: Let C' be a [7,4,3] Hamming code whose parity check matrix H is a $3 \times 7$ matrix as follows:

$$H = \begin{pmatrix} 1101100 \\ 1011010 \\ 0111001 \end{pmatrix}$$

This $3 \times 7$ matrix H provides in conventional fashion a $4 \times 7$ generator matrix G as follows:

$$G = \begin{pmatrix} 1000110 \\ 0100101 \\ 0010011 \\ 0001111 \end{pmatrix}$$

A codeword is generated from a vector v by multiplying v by G. The expression v·G may be written $$(1\ 1\ 0\ 1) \cdot G = (1\ 1\ 0\ 1\ 1\ 0\ 0).$$

Assume now an information string u=1101. Using the generator matrix G, this information string is encoded into the codeword v=1101 100. Since w(v)=4 and the integer part of 4/3 is 1, in binary this is 01 and its complement is 10. The final encoded vector is $v_1=1101\ 100\ 10$, which consists of v and the tail 10. Note that it is now necessary to add only two bits to codeword v because the weight of v was divided by d. By contrast, since Berger does not divide by d, his method requires three bits.

Encoding Example B: To encode the information string u=0000, a similar procedure is followed to obtain an encoded vector $v_2=0000\ 000\ 11$.

It will now be apparent that the vectors $v_1$ and $v_2$ are unordered; i.e., their supports are {1,2,4,5,8} and {8,9}, respectively.

According to the invention, the savings in the number of bits in the tail is partially a function of the ECC selected and its codeword length. For example, consider a [63,51,5] two-error correcting BCH code. To make the codewords unordered using the Berger procedure, six extra bits will be needed because $\log_2 64$ is 6; whereas, according to the present invention, $\lceil \log_2 \lfloor 64/5 \rfloor \rceil = 4$ bits are needed, which is a saving of two bits. Finally, consider the [23,12,7] Golay code. To make the codewords unordered using the Berger procedure, five extra bits are needed; whereas, with applicants' invention, $\lceil \log_2 \lfloor 24/7 \rfloor \rceil = 2$, and hence only two bits are needed, a saving of three bits.

Note that applicants' encoding algorithm involves the use of a new code that has a length $n + \lceil \log_2 \lfloor (n+1)/d \rfloor \rceil$, and is systematic if the code C' is systematic; whereas, by contrast, Berger's code construction corresponds to the special case in which C' is a [k,k,1] code.

EXAMPLE OF SPECIAL ENCODING CASE

The construction may be made more efficient when the all-1 vector is in C' by taking a coset of applicants' code. The construction is analogous but there are less than n+1 different weights in the coset. Assume w is the minimum weight in the coset (i.e., the minimum number of 1's of all codewords in the coset). When encoding, the tail is now the weight minus w divided by d, complemented. The all-1 vector belongs in most codes used in practice like Hamming, BCH, and Golay.

To illustrate this last point, let C' be the [7,4,3] Hamming code whose parity check matrix H was given earlier, and take the coset w⊕C', where w=1000000 and where ⊕ is the EXCLUSIVE OR operator. The weights of w⊕C' range from 1 to 6; so, when divided by 3, the length of the tail is only 1. The minimum weight in the coset is w=1.

To encode the information string u=1101, the encoded vector is w⊕v, where v=1101 100, and thus w⊕v=0110110.

Since w⊕v has weight 4, this number minus 1 divided by 3 is 1, whose complement is 0. Hence, the final encoded vector is 01101000. Thus, one less redundant bit is needed than in the previous case.

DECODING

To decode a potentially noisy version of a codeword, the errors in the error correcting part are corrected (if possible) and the tail is recomputed and added at the end. Then the decoded codeword is compared with the received noisy version. If they differ by more than the error correcting capability of the code, an uncorrectable error is declared; otherwise, the information part of the corrected codeword is outputted as the estimate of the transmitted information bits.

Figure 2:
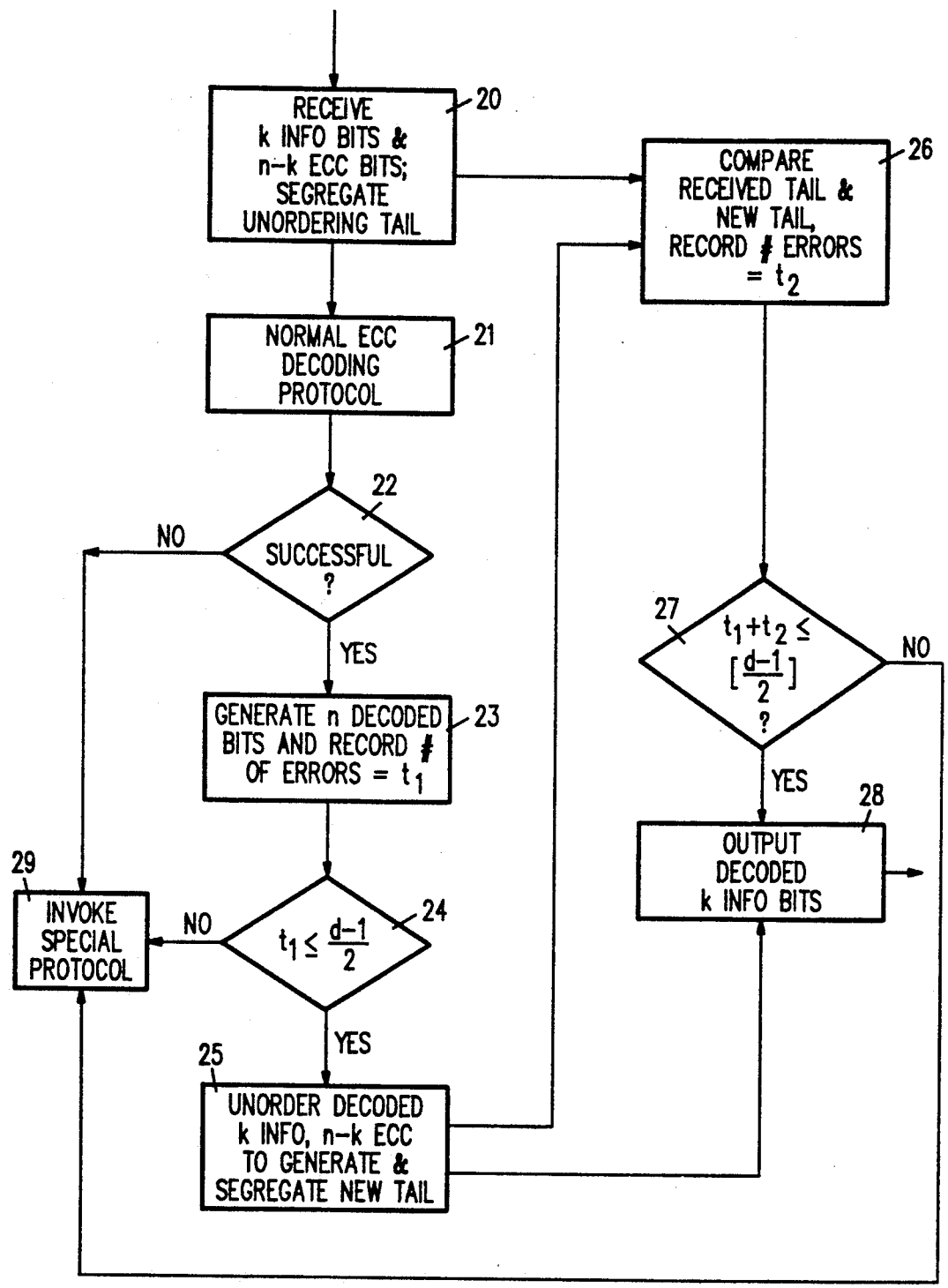
FIG. 2 is a flow chart depicting the steps in decoding an unordered error correcting code in accordance with the invention.

FIG. 2 shows a flow chart depicting the method for decoding unordered codes in accordance with the present invention. A noisy version of a previously encoded code is received and separated at 20 into k information bits, n-k ECC redundancy bits, and unordering tail bits. The information and ECC bits are processed normally at 21 by an appropriate decoding algorithm for the selected ECC code. A decision is made at 22 as to whether decoding is successful. If successful, the decoded information and ECC bits will be passed to circuitry 23 which generates the decoded n-bit codeword and records the number of corrected errors $t_1$. At 24, a determination is made as to whether this number is within the constraints of the code; i.e., if $t_1 \leq (d-1)/2$. Then a tail is appended to this decoded vector following a procedure similar to that employed for encoding. The received tail bits are compared at 26 with the tail bits obtained at 25 and a record is made of the number of errors $t_2$ in the tail. Now the total number of errors detected ($t_1+t_2$) is tested at 27 to determine if it is within the constraints of the unordered ECC; i.e., if $t_1+t_2 \leq$ $$\frac{d-1}{2}.$$

If the total number of errors is within the constraints of the unordered ECC, the decoded information (data) bits from 25 are outputted at 28 as the decoded information.

If the total number of errors is not within the constraints of the unordered ECC, an uncorrectable error protocol will be initiated by circuitry 29. This protocol may include stopping operation, backing up, resending a fixed number of vectors, or employing any other desired control operation within the error constraints of the unordered ECC.

Consider again the [7,4,3] Hamming code previously used as an example. Assume that the received vector is w=1001 110 10. According to the decoding algorithm, consider v=1001 110. The syndrome, using the parity check matrix, is 111. This corresponds to the fourth column, so there is an error in the fourth location and the decoder produces the decoded vector v'=1000110.

Using the encoding procedure, since w(v')=3 and d=3, w'=1000 110 10 when a new tail is added. Comparing w and w', note that they differ in only one location, so the decoder outputs the estimate of the four information bits as 1000.

Assume now, however, that the decoder receives w=0001 000 10. Decoding v=0001000, we obtain v'=0000 000, which gives w'=0000 000 11. In this example, $t_1=1$ and $t_1+t_2=2$. Comparing w and w', we see that they differ in two locations. The error correction capability of the code has been exceeded. The decoder declares an uncorrectable error and activates the protocol circuitry 29.

In the case where the original code is a coset of a code instead of the code itself, the procedure is analogous. Cosets are decoded by adding first the vector representative of the coset and then decoding over the code itself.

Figure 3:
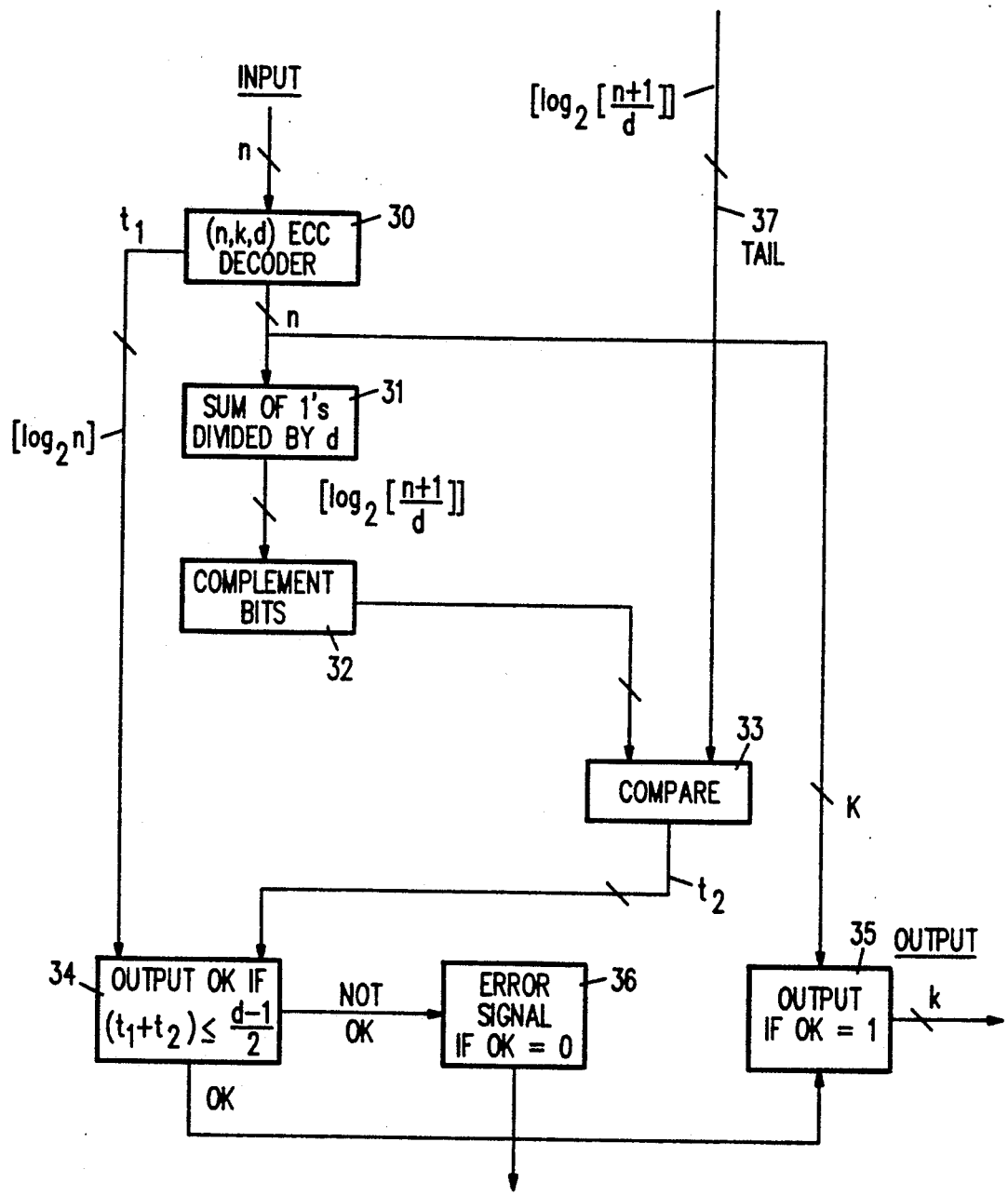
FIG. 3 is a block diagram of an apparatus for decoding an unordered error correcting code in accordance with the invention.

FIG. 3 is a self-explanatory functional block diagram for an apparatus for implementing the decoding algorithm according to the present invention. This apparatus comprises a conventional decoder 30 for an [n,k,d] error correction code which, in addition to a decoded vector of length n to divider circuit 31, outputs to 34 the number of errors $t_1$ that have occurred. Circuit 31 divides by d the weight (i.e., number of 1's) of the decoded vector and supplies the result in binary form to a circuit 32 that complements the output from 31. Circuit 33 compares the output of circuit 32 with the tail received via line 37 and outputs the number of errors $t_2$ in the tail. Circuit 35 outputs the k decoded bits from 30 when the OK signal from 34 is 1, whereas circuit 36 provides an uncorrectable error signal to the user when the OK signal from 34 is 0.

Thus, in both the encoding and decoding of the codes of the present invention, there is a step involving adding the tail to the ECC. Encoding and decoding can thus desirably be implemented by using conventional encoder and decoder hardware and just adding circuitry that computes the tail.

In summary, it will now be seen that applicants' encoding and decoding method and apparatus provide an improved unordered error correcting code by dividing the weight of the ECC codewords by the minimum distance d each pair of these codewords is apart and converting the integer obtained by this division into the complement in binary form of said integer.

Although Berger unorders vectors by adding tail bits to produce unordered codewords, his codes have no ECC capability. Even if Berger's unordered code construction were used to implement applicants' preferred algorithm, it would require more unordering tail bits than are required using applicants' technique.

While the invention has been particularly shown and described with reference to a preferred embodiment thereof, it will be understood by those skilled in the art that various changes in form and details may be made therein without departing from the spirit and scope of the invention. Accordingly, the method and apparatus herein disclosed are to be considered merely as illustrative and the invention is to be limited only as specified in the claims.

We claim:

1. A method of decoding unordered codewords of an unordered error correcting code, each of which comprises k information bits, n−k ECC bits, and unordering tail bits, each arbitrary pair of n bits being at least a distance d apart, where $d \geq (2t+1)$ and t is the maximum number of errors correctable by the code comprising the steps of:

segregating the unordering tail bits to produce a noisy received version of an ECC codeword;

decoding the noisy received version of the ECC codeword with the tail bits truncated and applying a preselected error correcting algorithm to correct $t_1$ actual errors and produce a decoded ECC codeword;

generating a selected number of tail bits corresponding to the decoded ECC codeword;

comparing the segregated tail bits for the noisy received ECC codeword with the generated tail bits for the decoded ECC codeword for determining the number $t_2$ of errors actually detected; and providing as an output the k information bits derived from the decoded ECC codeword when $(t_1+t_2) \leq t$.

2. The method of claim 1, wherein said selected number is the least number of tail bits required to produce the unordered ECC codewords.

3. The method of claim 1, including the step of:

activating an uncorrectable error-responsive protocol when $(t_1+t_2) > t$.

4. An apparatus for constructing an unordered error correcting code (ECC) that accepts k bits of information, comprising:

an encoder for encoding electrical signals representing the k bits of information with an ECC encoding algorithm to transform them into electrical signals constituting ECC codewords, each arbitrary pair of which is at least a distance d apart, where $d \geq (2t+1)$ and t is the maximum number of errors correctable by the code; and electrical circuitry for generating and appending to each of the ECC codewords a selected number of electrical signals constituting tail bits to produce unordered ECC codewords.

5. The apparatus of claim 4, wherein said circuitry comprises:

a tail generating circuit for dividing the weight of each codeword by d to determine the integer part of the resulting quotient and generating a binary representation of the value of the integer part of each codeword; and a complementing circuit for complementing each such binary representation to provide the tail bits that are appended to the ECC codewords.

6. The apparatus of claim 4, wherein said selected number is the least number of tail bits required to produce the unordered ECC codewords.

7. An apparatus for decoding unordered codewords of an unordered error correcting code, each of which comprises k information bits, n−k ECC bits, and unordering tail bits, each pair of n bits being at least a distance d apart, where $d \geq (2t+1)$ and t is the maximum number of errors correctable by the code comprising:

means for segregating the unordering tail bits to produce a noisy received version of an ECC codeword;

means for decoding the noisy received version of the ECC codeword with the tail bits truncated;

means for applying a preselected error correcting algorithm to correct $t_1$ actual errors and produce a decoded ECC codeword;

means for generating a selected number of tail bits corresponding to the decoded ECC codeword;

means for comparing the segregated tail bits for the noisy received ECC codeword with the generated tail bits for the decoded ECC codeword for determining the number $t_2$ of errors actually detected; and means for outputting the k information bits derived from the decoded ECC codeword when $(t_1+t_2) \geq t$.

8. The apparatus of claim 7, including means for initiating a desired control operation when $(t_1+t_2) > t$.

* * * * *